US005594199A

United States Patent [19]
Ciaccio

[11] Patent Number: 5,594,199
[45] Date of Patent: Jan. 14, 1997

[54] EMI BAFFLE FOR ELECTRONIC CONTROL

[75] Inventor: Michael P. Ciaccio, Canton, Mich.

[73] Assignee: Ford Motor Company, Dearborn, Mich.

[21] Appl. No.: 408,802

[22] Filed: Mar. 23, 1995

[51] Int. Cl.⁶ ..................................................... H05K 9/00
[52] U.S. Cl. ........................ 174/35 R; 361/818; 174/52.1
[58] Field of Search ............................ 174/35 R, 35 GC, 174/50, 50.51, 50.52, 50.54, 50.59, 50.6, 52.1, 65 R; 361/816, 818

[56] References Cited

U.S. PATENT DOCUMENTS

| 3,007,041 | 10/1961 | Matteson | 240/78 |
|---|---|---|---|
| 4,763,224 | 8/1988 | Bentz et al. | 165/80.3 X |
| 4,851,609 | 7/1989 | Reddy | 174/35 |
| 4,910,434 | 3/1990 | Doumani et al. | 315/3 |
| 5,064,388 | 11/1991 | Paladel | 439/607 |
| 5,204,497 | 4/1993 | Herrick | 174/35 |
| 5,239,126 | 8/1993 | Oshiba | 174/35 R |
| 5,243,131 | 9/1993 | Jakob et al. | 174/52.1 |
| 5,253,143 | 10/1993 | Klinger et al. | 361/736 |
| 5,317,105 | 5/1994 | Weber | 174/35 |
| 5,392,197 | 2/1995 | Cuntz et al. | 361/818 |
| 5,418,685 | 5/1995 | Hussmann et al. | 361/719 |

Primary Examiner—Bot L. Ledynh
Attorney, Agent, or Firm—Mark L. Mollon; Roger L. May

[57] ABSTRACT

An electronic control module includes an EMI baffle in the form of openings formed in laterally spaced portions of the cold plate supporting the electronic circuits. Preferably, upper and lower plates of the cold plate define a limited access baffle chamber with openings that require rerouted travel of any leakage radiation emanated by terminals or conductors carried by couplers inserted into the cold plate openings or passing through the openings. Preferably, each coupler is inserted through openings having an inlet axis in the cold plate and the module packaging covers are secured to the cold plate between an inlet and an outlet opening in the cold plate. Accordingly, simple gaskets may be used to seal the covers against the cold plates and the couplers against the cold plate. Moreover, the cold plate coolant passage has inlets and outlets that remain exposed exteriorly of the covers to avoid exposure of the internal circuitry to leakage.

11 Claims, 3 Drawing Sheets

EMI BAFFLE FOR ELECTRONIC CONTROL

TECHNICAL FIELD

The present invention relates generally to electromagnetic interference (EMI) shields, and more particularly to such shields used in electronic control units that include cold plates to support electrical circuitry within a housing cover.

BACKGROUND ART

High frequency electromagnetic noise and radiated emissions can travel along electrical cables and through housing apertures that receive cable connectors for entry into otherwise shielded housings. For example, previously known electronic control modules that include microprocessor circuitry for controlling passenger vehicle operations often include processing circuits that must be shielded from strong electrical currents and voltages that are generated by power supplies under the control of or in response to the processing being performed in the module. The module generally includes a housing cover over the circuitry, and the housing cover is often made of metal to form a shield that prevents the circuitry from being affected by stray radiation. Nevertheless, the electrical connections that must be made to the circuits carried within the housing provides access for stray radiation to leak into the housing and affect the operation of the circuitry carried within the housing.

In previously known control modules, the circuitry is often carried on a cold plate, particularly designed to cool the circuitry in which it is carried. However, while the circuits are carried upon the cold plate, the housing covers are also carried by the cold plate, and electrical connectors to the circuits are provided through openings in the housing wall. Although shields have been developed to reduce entry of stray radiation in these openings, such structures often require the manufacture and assembly of numerous parts and proper installation over the conductors and the opening in order to properly shield the interior of the housing from the stray radiation. For example, the conductors may be carried by a connector with a conductive shield and specially insulated supports for the conductor so that the conductive shield mounted in a grounded connection with the remaining housing cover to minimize the flow of EMI, including RFI, into the housing. As a result, the special shields may be particularly difficult to install and can substantially increase the expense of the housing structure.

Moreover, connectors which extend through openings in the housing cover substantially complicate the assembly and disassembly of the electronic control module. In particular, since the connector carries conductors that must be wired to circuits carried by the cold plate, the wire length limits the displacement of the housing from the cold plates and obstructs repair of the circuitry unless the wiring is detached from the circuit. Therefore, the previously known control module housing structures are substantially more difficult to assemble and to disassemble for repair. Often, to obtain access to the control circuitry carried on the cold plate, the connector must be disassembled from the housing cover. However, since displacement of the housing cover is limited by the length of the conductors carried by the connector held in the housing cover, such disassembly must be performed in a restricted access area. As a result, it is often necessary to loosen the cover from the cold plate, displace the cover to the extent possible against the restraint of the conductors connected to the circuits, and disconnect the conductors from the circuits before it is possible to further displace the housing away from the cold plate. Thus, both the assembly and the disassembly of such control module housings can be extremely difficult, particularly where small I.C.'s or circuit boards are installed within the module housing walls. Alternatively, the connector must be constructed in multiple pieces to permit easy removal of the connector from the housing walls before the housing cover is removed from the cold plate.

Another known feature of previous control module housing construction comprises separation of the high power connectors and circuits from the low power connectors and circuits by the cold plate. In particular, the high power conductors connect to circuits mounted on one side of the cold plate, and are separated by the cold plate from the low power connectors and their connections with circuits mounted on the opposite side of the cold plate. However, while this avoids interference within the housing, each side of the cold plate has a separate cover that carries a separate connector. As a result, the difficulties of removing the housing covers carrying the connectors, and the problems discussed above related thereto, are compounded by such an arrangement.

A further improvement to reduce the difficulty of accessing the circuits in the control module is provided by securing the high power connector directly to the cold plate and unattached to the top cover. However, such a construction provided a direct path for the EMI to radiate into or out of the electronic box, and required environmental sealing between the high power connector and the cold plate, between the cover and the cold plate, and between the connector and the cover. Since each of these materials may react differently to environmental conditions, the problems of sealing are exacerbated by such a construction as numerous non-planar interfaces and multiple open-ended gaskets or seals are assembled.

Another attempt to avoid these problems involved the redesign of the top cover to include a first side wall portion that carried both the high power and low power connectors, and a separate top cover plate to form a housing on one side of the cold plate. This multiplication of housing parts had to be repeated in module constructions where both sides of the cold plate were used to support the circuitry. Moreover, the high side wall structure limits access to the conductor connections with the circuits in the module, and requires the circuits to be assembled and the conductors to be secured, in a five-sided enclosure that complicates both assembly and repair by inhibiting movement and manipulation of tools and parts in the bounded area. In particular, specially designed or configured tools may be required to reach the components or conductors to be installed or assembled in view of the limited work area defined between the raised side walls.

SUMMARY OF THE INVENTION

The present invention overcomes the above-mentioned disadvantages by providing an EMI baffle in a cold plate including an opening laterally positioned with respect to circuitry mounted on the cold plate the baffle obstructs the flow of radiation to the circuits carried on the cold plate in a control module housing. In general, the opening has an inlet axis arranged at an angle to an outlet axis to form a corner in the flow path that reduces the flow of stray radiation toward the circuits in the housing. The obstructed path may be formed in part by walls of the cold plate or housing cover portions that restrict access to the enclosed circuitry.

In general, a connector is formed by a plug body that carries at least one conductor for entry into a module housing so that the conductor can be connected to the circuits carried by the cold plate. The plug body is shaped to correspondingly fit within an opening in the cold plate. The opening inlet may have an axis formed at an angle to the axis of the opening outlet, for example, an outlet formed by the cold plate wall aligned across the bottom of an opening in the top wall of the cold plate.

In another embodiment, the shielding of the baffle is improved by providing a plurality of openings corresponding in number to the number of connectors to be introduced to the control module enclosure, the connector having at least one plug body dimensioned to be received in each of the openings, and each opening is preferably formed as a cylindrical wall in the cold plate. In addition, a first housing cover covers the circuit support area on a side wall of the cold plate, but exposes the opening carrying the connector that exposes the conductors to the exterior of the housing. Preferably, the opposite side of the cold plate from the exposed conductors is also covered by a housing cover.

As a result, the present invention provides an improved electronic control module with EMI shielding formed by a baffle formed in the cold plate of the control module package. Moreover, the present invention provides an improved module construction in which high power conductors are baffled or separated from the low power conductors throughout the control circuit mounting areas within the module housing. The present invention also provides a connector that baffles each conductor along a substantial path portion of the connector access opening.

In addition, the present invention avoids the complicated assembly and disassembly encountered when the connectors are carried by the housing covers.

In addition, the environmental seals are planar and close ended to circumferentially seal the interface between only two parts, so as to avoid the need to seal between three separate parts as was required by the previously known connectors mounted on the surface of the cold plates. Moreover, the present invention provides ease of access, whereby the electronics can be assembled and serviced on the top or bottom of the cold plate without obstruction as in previously known five-sided enclosures. In addition, the top and bottom covers are removable without disconnection of wires to further ease access to the module circuitry for repair. Moreover, the present invention does not expose conductors or electronics to a direct leak path with the coolant passing through the cold plate.

BRIEF DESCRIPTION OF THE DRAWINGS

The present invention will be more clearly understood by reference to the following detailed description of a preferred embodiment, when read in conjunction with the accompanying drawing in which like reference characters refer to like parts throughout the views and in which.

DETAILED DESCRIPTION OF THE PREFERRED EMBODIMENT

Figure 1:
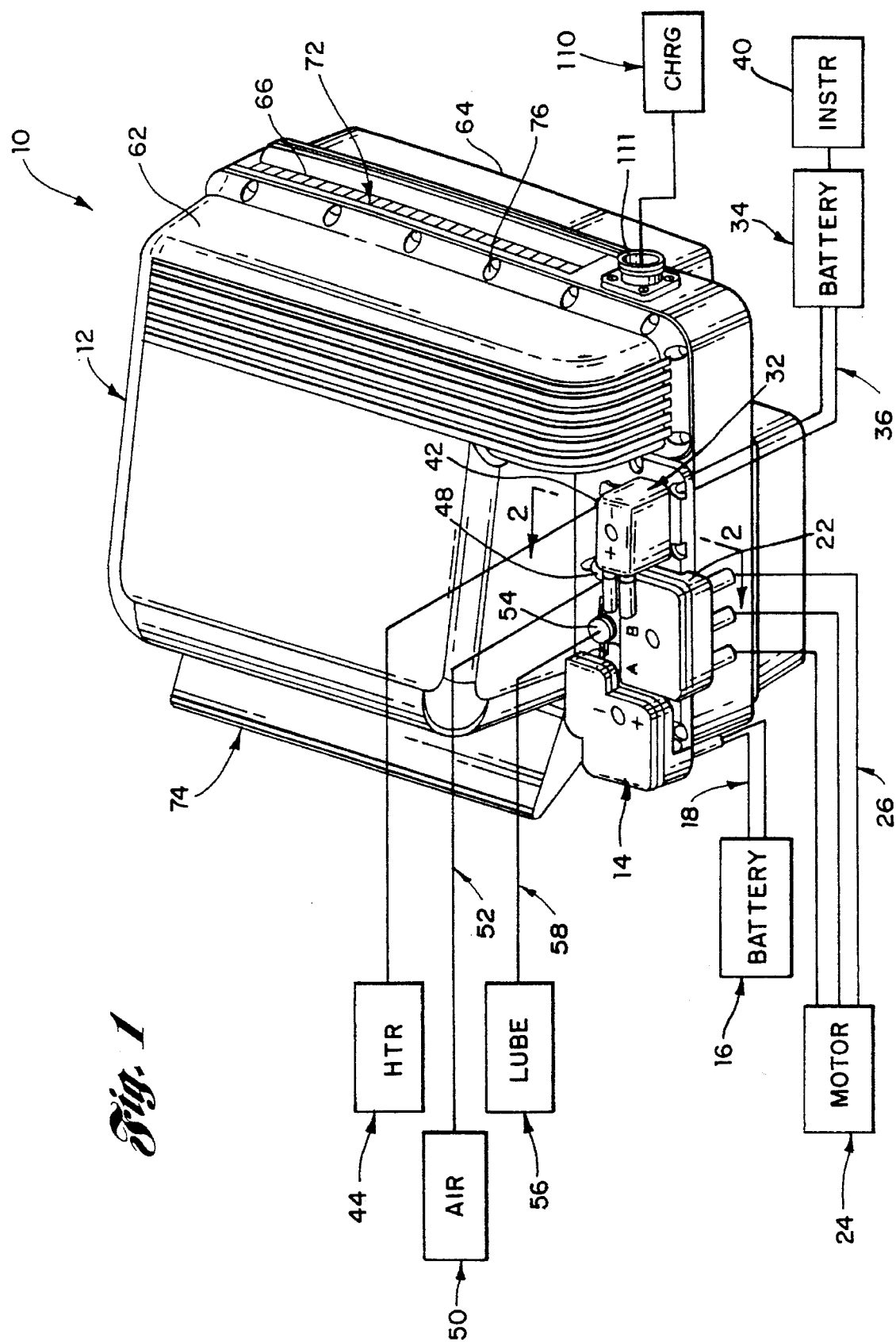
FIG. 1 is a perspective, partially schematic view of an electrical system including an electronic control module package according to the present invention.

Referring first to FIG. 1, an electrical system 10 for an electric powered vehicle is there shown comprising an electronic control module 12 with microprocessing controller circuits coupled to various electrical components throughout the vehicle. In particular, a battery coupler 14 is mounted in accordance with the present invention to couple a battery 16 to a circuit 20 (FIG. 2) carried in the electronic control module 12. Similarly, a motor coupler 22 permits coupling of a three-phase AC motor 24 by appropriate conductors and wiring to the inverter circuit 28 (FIG. 2) carried in the electronic control module 12. Similarly, a DC-to-DC coupler 32 is mounted in accordance with the present invention to couple a DC-to-DC converter circuit 38, for connection to a battery 34, for example, a 12 volt storage battery, for operation of various vehicle instrumentation generally indicated at 40.

The electrical system 10 also includes a heater 44 coupled by appropriate conductors to the heater coupler 42 that is mounted in accordance with the present invention to couple the heater 44, for example, a Ford electric vehicle demonstration fleet resistance heater, with the control circuit 45 (FIG. 2) carried in the electronic control module 12, for example, a positive temperature coefficient (PTC) control circuit. An air conditioning unit 50, for example, a electrically driven compressor unit driven by a three phase AC motor, is similarly coupled by appropriate conductors through the coupler 48 in accordance with the present invention to couple with the control circuit 49 (FIG. 2), for example, an inverter control in the ECM 12 for operating the AC motor driving the compressor unit. In addition, a lubrication pump unit 56 coupled by appropriate conductors to the lube pump coupler 54 that is mounted in accordance with the present invention to lubrication control circuit 57 (FIG. 2) carried in the electronic control module 12, for example, another inverter control for a three phase AC motorized pump.

Figure 2:
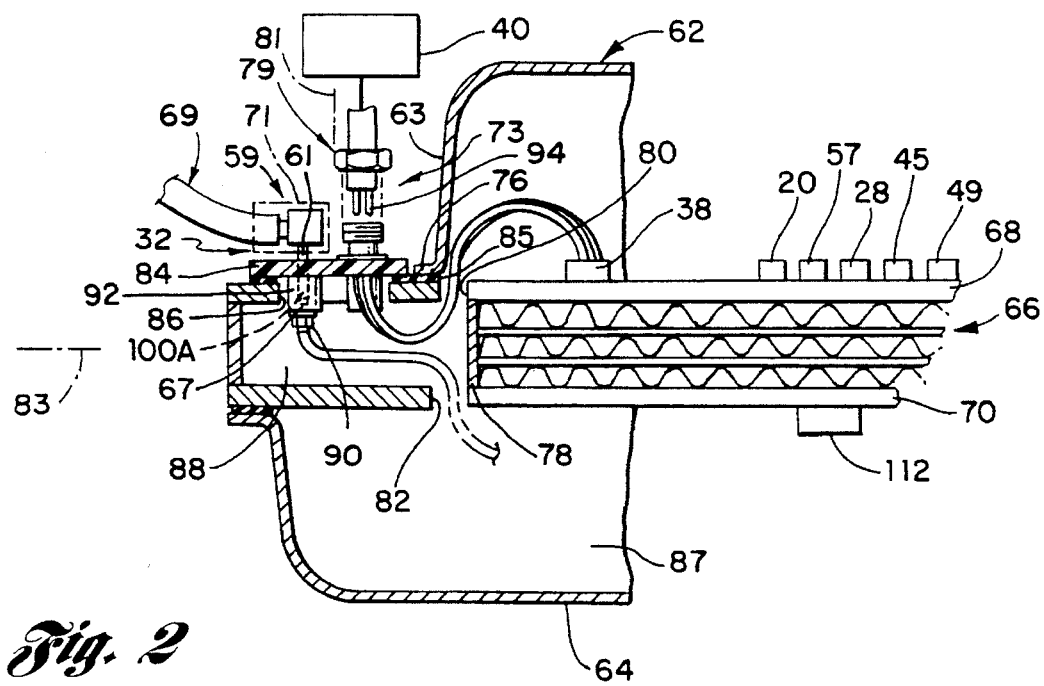
FIG. 2 is a sectional view taken substantially along the line 2—2 in FIG. 1.

As best shown in FIG. 2, the couplers may include large capacity conductor terminals 59 including a large diameter pin 61 carried in a receiving socket 67, the pin 61 being secured to a cable 69 extending out of a rubber cover 71. Such a construction is useful for a coupler which must handle on the order of 100 amps of current for circuits such as the battery 16, motor 24 and battery 34. The number of terminals 59 employed in each of the couplers 14, 22 and 32 of the preferred embodiment corresponds to the number of conductors necessary to operate the circuit.

Alternatively, couplers may be in the form of multiple pin terminals 73 that may deliver power signals and control signals between the controlled circuit and the controller circuitry in the ECM 12. For example, a coupler mounted on the plate 84 may be a socket 75 to receive a plug 79 with multiple prong conductors 94. Such terminal couplers may be used with circuits that handle on the order of 10 amps of current, such as heater 44, air conditioner 50 or lubrication 56 through the couplers 42, 48 and 54, respectively. For example, the coupler 42 may include two pins or prongs and two sockets for an interlock circuit that detects disconnection of terminals. 73 at the coupler, as well as three prongs for delivering three phase AC current to the motor driven pump of the lube circuit 56.

A battery charger unit 110 is similarly coupled by appropriate conductors through the coupling 111 in accordance with the present invention to couple with the battery charger module 112 (FIG. 2) in the ECM 12.

The electronic control module 12 is packaged by the cold plate 60 carrying an upper cover 62 and a lower cover 64. As best shown in FIG. 2, the cold plate 60 includes a coolant flow passage 66 between upper aluminum plate 68 and a lower aluminum plate 70. The passage 66 is formed intermediate an inlet 72 and an outlet 74 which remain exposed exteriorly of the covers 62 and 64 so that any leakage in the fluid path does not permit leakage within the chambers defined by the covers 62 and 64. The passage 66 may be tortuously configured or labyrinthed as desired. In the preferred embodiment, a plurality of layers of corrugated sheet are stacked between the plates 68 and 70 to provide large surface areas for heat transfer to fluid flowing through the passage 66 from the inlet 72 to the outlet 74.

Referring again to FIG. 1, the cover 62 is mounted to the top plate of the cold plate 60 by fasteners threaded into the upper plate 68 through apertures in a cover flange 76. A similar arrangement may be used to secure the lower cover 64 (not shown). In any event, the cover 62 has a sidewall 63 that lies adjacent to but does not extend over the portion of the cold plate 60 that carries or receives the couplers 14, 22, and 32. Likewise, the couplers 42, 48, and 54 are similarly outside the confines of the upper cover 62. Accordingly, the couplers need not be removed, loosened, or separated from the circuits carried on the cold plate in order to remove the housing covers. As a result, the gasket 85 may be a planar, close-ended gasket that improves the seal between the parts 60 and 62.

Referring again to FIG. 2, the corrugation passages forming the flow path 66 through the cold plate 60 terminate at side wall 78, while adjacent portions of upper plate 63 and lower plate 70 include openings 80 and 82, respectively. Conductors such as wires pass through the openings 80 and 82 to join the couplers, for example, coupler 32 shown in FIG. 2, by electrically connecting the conductors to the control circuits as at circuit 38, for example, by soldering. The side wall 63 of the cover 62 is positioned outside of the opening 80 as the flange 76 rests on the gasket 85 over a plate portion intermediate the opening 80 and an opening 86.

A plate 84 carrying couplers 14, 22, 32, 42, 48, and 54 also rests on the gasket 85 and covers over the opening 86 in the upper plate 68. The opening 86 communicates with the chamber 88 formed between the upper plate 68 and lower plate 70 adjacent to the cover 62. It may be appreciated that the plate 70 forms a wall aligned in a direction that enables any radiation from the terminals 90 to travel at a right angle to the inlet axis 81 in a direction toward the flow path 66, then along axis 83 and turning again through the opening 80 or the opening 82 along axis 87 before entering the chamber defined in a cover over the electronic circuits 20, 28, 38, 45, 57 and 112.

Figure 3:
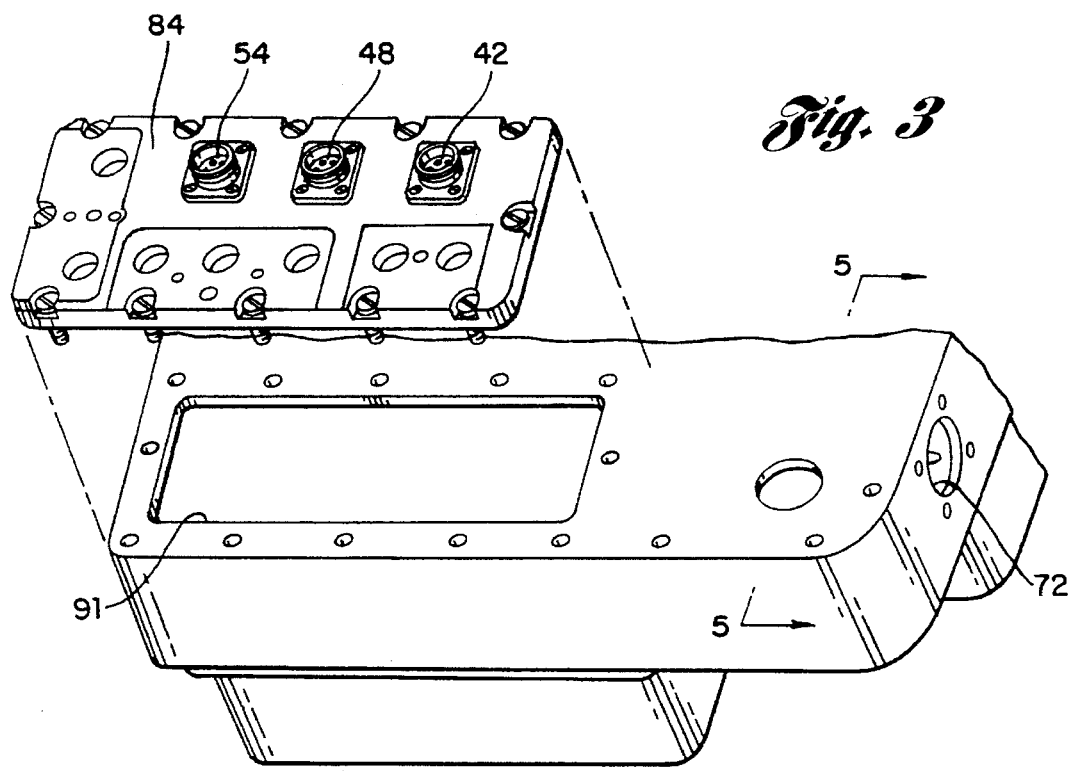
FIG. 3 is a perspective view of an electronic control module as shown in FIG. 1 but with parts removed for the sake of clarity.
Figure 4:
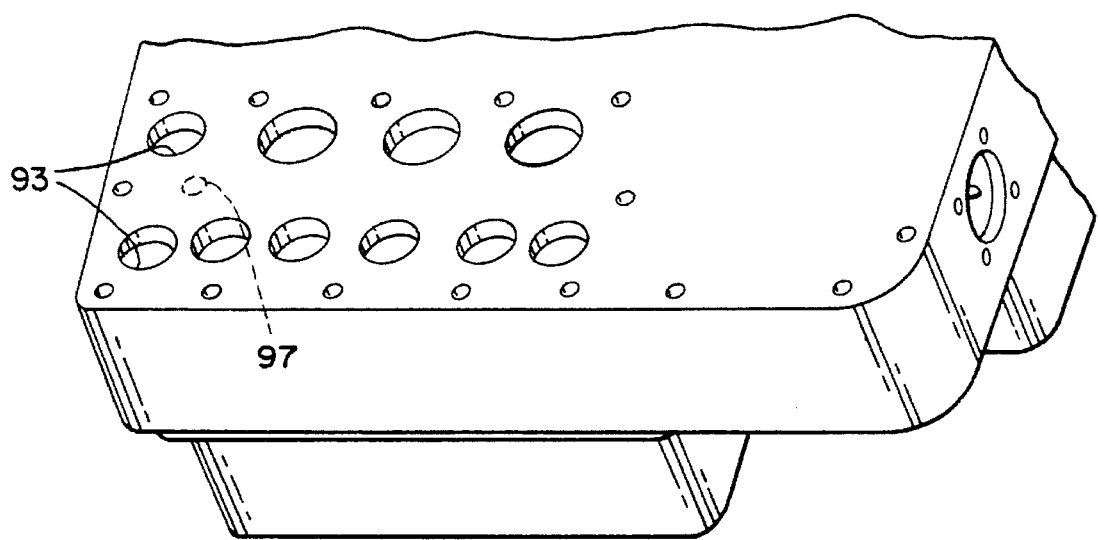
FIG. 4 is a perspective view similar to FIG. 3 but showing a modified arrangement of the control module package according to the present invention.

As best shown in FIG. 3, the opening 86 may be a single opening 91 adapted to receive the gusset-reinforced bosses 92 (FIG. 2) carried by the plate 84. Alternatively, the bosses 84 may be individually formed in an elongated cylindrical shape, without the gussets connecting the bosses, to fit within circular openings 93 shown in FIG. 4 in the plate 68 to further eliminate the leakage or transmission of EMI into and out of the enclosed chambers between the covers 62 and 64. The plate 84 may be eliminated completely and couplers 14, 22, 32, 42, 48, and 54 may be mechanically mounted and sealed by a gasket directly to the upper plate 68 through circular openings 93, the plate 68 then including hole patterns surrounding each opening as designated diagrammatically at 97.

Figure 5:
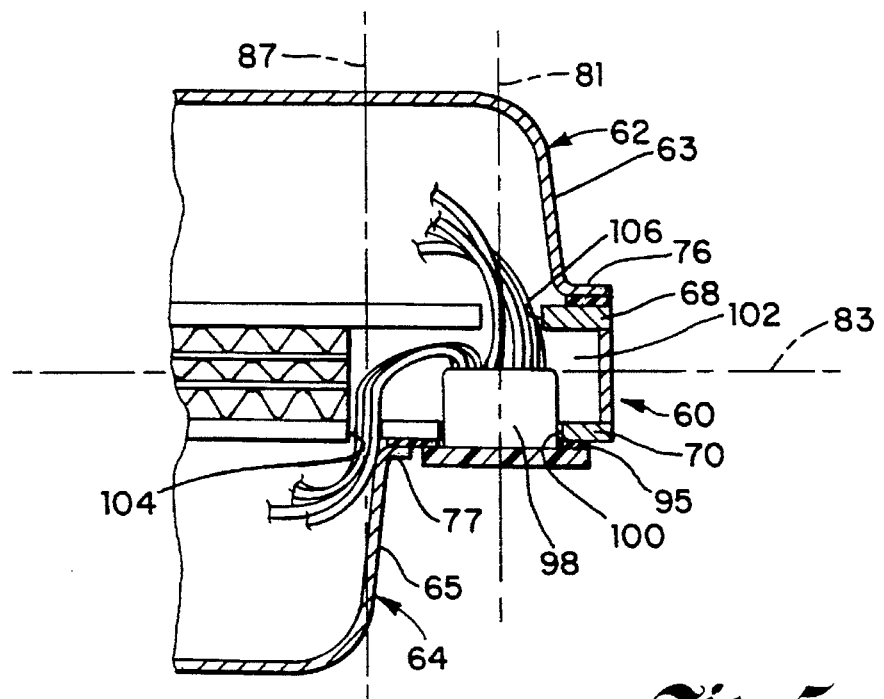
FIG. 5 is a sectional view taken substantially along the line 5—5 in FIG. 3, with the removed parts in place as shown in FIG. 2.

As shown in FIG. 5, a coupling 98 may also be retained in a socket formed by an opening 100 in the lower plate 70 of the cold plate 60. As a result, the side wall 65 of lower cover 64 is positioned between the opening 100 and opening 104 in the lower plate 70 as the flange 77 rests on gasket 95. The opening 100 communicates with the chamber 102 along an axis 81. At least a portion of the wire path may be offset from the axis 81, but parallel to it, so long as such an opening is laterally spaced away from the circuits on cold plate wall 68. Such an opening provides a less tortuous path in a low voltage environment, or where a thick accumulation of wires will not permit flexure at a tight radius into the cavity of the cover 62. Accordingly, wires extend through opening 106 in the upper plate 68 to reach the chamber in cover 62. The opening 106 is offset toward the side wall 63 of the upper cover 62 to form the baffle for the reduction of EMI into and out of the package of the ECM 12. Another path portion is aligned along axis 83 for communicating with an opening 104 extending along axis 87 in the plate 70 through which wires or other conductors can be routed to reach the chamber within the lower cover 64.

As a result, it will be understood that the electronic circuits are assembled and serviced easily on either the top or bottom of the cold plate 60 by simple removal of the covers 62 and 64 without requiring disassembly or disconnection of wires to the couplings as in previously known cover-mounted connectors. In addition, the electronic circuits are readily exposed upon removal of the covers and do not require special tools to reach within the enclosure, as in previously five-sided known control module packages. In addition, the couplers are sealed to the cold plate, or insert-molded into the plate 84 which is sealed to the cold plate by a simple gasket. Thus, the structure avoids the need for sealing between three structures made of different materials with differing thermal expansion characteristics and differently aligned interfaces that must be sealed in order to avoid leakage of fluids. In addition, the assembly provides an efficient wiring path that reduces the ability of EMI to interfere with operation of the circuits encased within the housing or mounted externally adjacent to the electronic control module 12. Furthermore, direct leaks of coolant from the coolant path remain outside the electronic circuit chambers to avoid unintended damage to the circuits or short-circuiting.

Having thus described my invention, many modifications thereto will become apparent to those skilled in the art to which it pertains without departing from the scope and spirit of the present invention as defined in the appended claims.

What is claimed is:

1. An electronic control module package for a plurality of electrical circuits comprising:

a cold plate having at least one first lateral surface area carrying at least one circuit of said plurality of circuits and an opening laterally spaced from said first area and extending into said cold plate;

an electrical coupler including at least one conductor carried in a plug body, said plug body being dimensioned to be received in said opening;

a first cover defining a chamber disposed over said first surface area and having a side wall positioned between said laterally spaced opening and a second opening in said cold plate communicating with said chamber.

2. The invention as defined in claim 1 wherein said laterally spaced opening comprises a plurality of openings and said electrical coupler comprises a plurality of plug bodies corresponding in number to the number of openings.

3. The invention as defined in claim 2 wherein said openings are defined by circular openings in said cold plate wall.

4. The invention of claim 1 wherein said laterally spaced opening has an inlet axis, and wherein said second opening has an outlet axis aligned at an angle to said inlet axis.

5. The invention as defined in claim 4 wherein said cold plate defines a conductor path by a wall of said cold plate aligned at an angle to said inlet axis.

6. An EMI baffle for electronic control modules having a plurality of circuits mounted on a cold plate within a housing cover, said baffle comprising:

a laterally extended portion of said cold plate, said extended portion having an opening in the cold plate, said opening being peripherally defined by a peripheral edge in the cold plate outside the confines of said housing;

an electrical coupler comprising at least one conductor and a plug body insulated from said conductor, said plug body being dimensioned to be received in said opening in engagement with said peripheral edge independent of said housing;

a first housing cover portion covering said opening and said plug body on one side of said cold plate, said plug body exposing said at least one conductor externally of said housing on the opposite side of said cold plate from said first housing cover portion.

7. The invention as defined in claim 6 wherein said opening comprises a plurality of openings and wherein said plug body comprises a plurality of plug bodies corresponding in number to the number of openings.

8. The invention as defined in claim 7 wherein said plug bodies are mounted on at least one plate.

9. The invention as defined in claim 7 wherein each said opening is defined by circular openings in said cold plate.

10. An EMI baffle for an electrical connector of a control module for a battery powered vehicle including high power connectors and low power connectors, the control module having high power and low power control circuits carried by a cold plate within a housing, the baffle comprising:

an opening in said cold plate laterally offset from the high power and the low power circuits;

an electrical coupling carrying conductors for said high power control circuits and said low power control circuits, each of said conductors extending through at least one plug body dimensioned to fit within said opening and insulated from said conductor, wherein said opening has an inlet axis and communicates with a second opening having an outlet axis offset from said inlet axis.

11. The invention as defined in claim 10 wherein said offset comprises said inlet axis being aligned at an angle to said outlet axis.

* * * * *